(12) United States Patent
Matsumoto et al.

(10) Patent No.: US 6,383,465 B1
(45) Date of Patent: May 7, 2002

(54) CUBIC BORON NITRIDE AND ITS GAS PHASE SYNTHESIS METHOD

(75) Inventors: Seiichirou Matsumoto; Zhang Wenjun, both of Tsukuba (JP)

(73) Assignee: National Institute for Research in Inorganic Materials, Tsukuba (JP)

( * ) Notice: Subject to any disclaimer, the term of this patent is extended or adjusted under 35 U.S.C. 154(b) by 0 days.

(21) Appl. No.: 09/520,615

(22) Filed: Mar. 7, 2000

(30) Foreign Application Priority Data

Dec. 27, 1999 (JP) .......................................... 11-368978

(51) Int. Cl.[7] .......................................... C01B 21/064
(52) U.S. Cl. ...................................................... 423/290
(58) Field of Search ........................................ 423/290

(56) References Cited

U.S. PATENT DOCUMENTS

| | | | | |
|---|---|---|---|---|
| 4,443,420 A | * | 4/1984 | Sato et al. | 423/290 |
| 5,316,804 A | * | 5/1994 | Tomikawa et al. | 427/570 |
| 6,071,841 A | * | 6/2000 | Sumiya | 423/290 |
| 6,248,303 B1 | * | 6/2001 | Shioi et al. | 423/290 |

FOREIGN PATENT DOCUMENTS

| | | |
|---|---|---|
| EP | 0 476 825 | 3/1992 |
| FR | 2 724 645 | 3/1996 |

OTHER PUBLICATIONS

Chemical Abstracts 128:51930, (No Date).*
S. Manorama, et al., Journal of Physics D: vol. 26, No. 10, pps. 1793–1795, "Growth of BN Hot Filament Assisted Electron Beam Deposition," Oct. 14, 1993.
Y. Guo, et al., Phys. Stat. Sol., vol. 143, pps. K13–K17, "Growth of Cubic Boron Nitride Films By Hot Filament Assisted RF Plasma CVD," 1994.
Z. Song, et al., Appl. Phys. Lett., vol. 65, No. 21, pp. 2669–2671, "Textured Growth of Cubic Boron Nitride Film Substrates," Nov. 21, 1994.
F. Zhang et al., Applied Physics Letters, vol. 65, No. 8, pp. 971–973, "Deposition of High Quality Cubic Boron Nitride Films on Nickel Substrates," Aug. 22, 1994.
K. Liao, et al., Phys. Stat. Sol., vol. 151, pps. K01–K03, "Deposition of Cubic Boron Nitride Films Using DC ARC Discharge," Sep. 1995.

* cited by examiner

Primary Examiner—Wayne Langel
(74) Attorney, Agent, or Firm—Oblon, Spivak, McClelland, Maier & Neustadt, P.C.

(57) ABSTRACT

Cubic boron nitride which is obtained from a gas phase without using an ultra-high pressure and which distinctly shows, in the Raman spectrum, either characteristic scattering by phonon of an optical longitudinal wave mode at $1305 \pm 15$ cm$^{-1}$ or characteristic scattering by phonon of an optical transverse wave mode at $1056 \pm 15$ cm$^{-1}$, or both characteristic scatterings.

7 Claims, 4 Drawing Sheets

F I G. 5
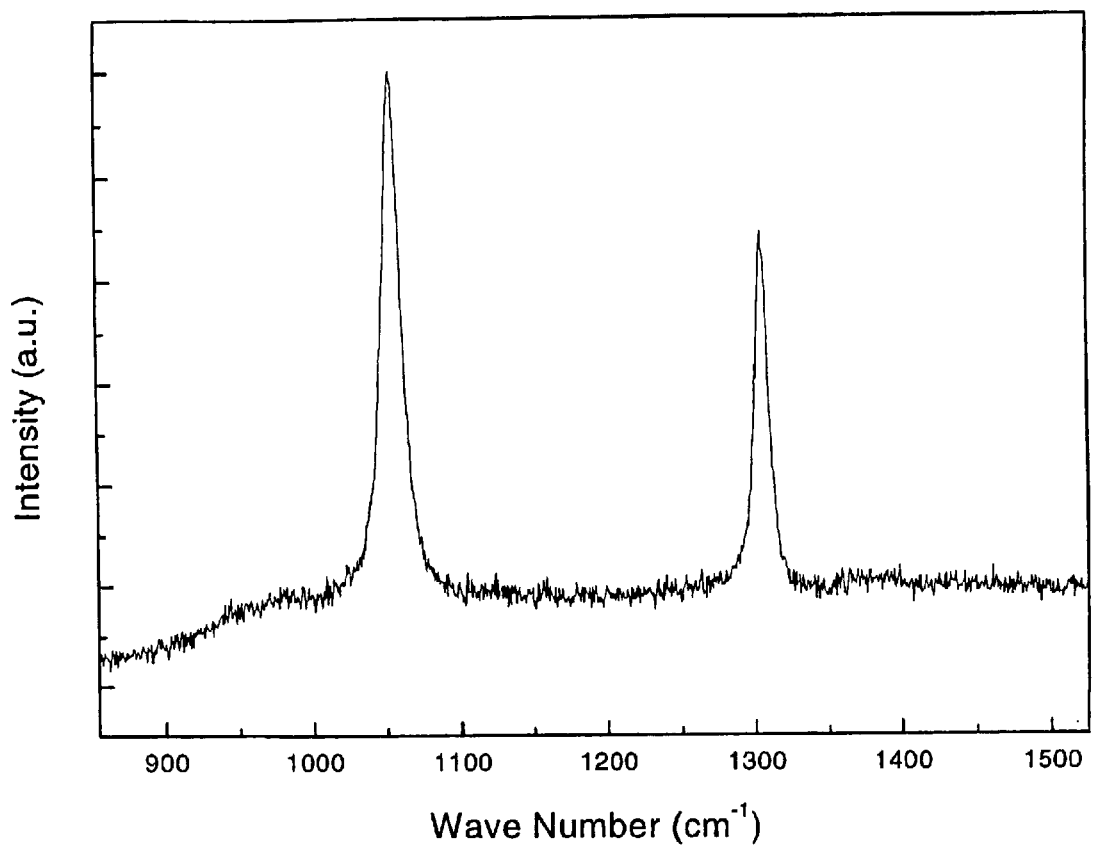

(a)

(b)

CUBIC BORON NITRIDE AND ITS GAS PHASE SYNTHESIS METHOD

BACKGROUND OF THE INVENTION

1. Field of the Invention

The present invention relates to a new-type cubic boron nitride and its gas phase synthesis method.

2. Discussion of Background

Cubic boron nitride is expected to be a potentially useful functional material in view of its characteristics such that it has the highest hardness and thermal conductivity next to diamond, it has the low reactivity with iron-family metals, and it has a wide band gap and can be a semiconductor. Its crystal grains have already been synthesized industrially under a high pressure of tens of thousands atom by using a super high pressure apparatus. However, with this method, it is difficult to control its form, and particularly it is very difficult to synthesize cubic boron nitride in the form of a film.

On the other hand, attempts have been done to synthesize it from a gas phase under a pressure lower than 1 atom. These methods are classified into two groups. One is physical vapor deposition methods (PVD) by utilizing ion bombardment to a substrate, including gas-activated reactive evaporation, bias-sputtering and bias ECR. In these methods, the pressure in a reaction chamber is as low as at most $10^{-1}$ Torr.

The other is chemical vapor deposition methods (CVD method), wherein a boron source such as diborane, boron trichloride, boron trifluoride, aminoborane or borazine, and a nitrogen source such as ammonia or nitrogen, are reacted. To suppress formation of hexagonal boron nitride, atomic hydrogen generated by a plasma or a heated filament, is utilized in many cases.

In the above CVD methods, the pressure in the reaction chamber is usually so high as from 10 to 160 Torr except for some cases. The CVD method without substrate-biasing is unestablished since a follow-up experiment has not succeeded. By CVD methods with substrate-biasing under a pressure of from $10^{-3}$ to $10^{-1}$ Torr, synthesis of cubic boron nitride has been reported.

However, cubic boron nitrides obtained in any of the above methods are usually a mixture with e.g. hexagonal system, or have poor crystal quality, and X-ray diffraction peaks of cubic boron nitride are not detected or are very broad, although an absorption can be seen in the vicinity of from 1050 to 1100 $cm^{-1}$ in the infrared absorption spectrum. In the infrared spectroscopic analysis, the absorption peak of cubic boron nitride is seen in the vicinity of from 1050 to 1100 $cm^{-1}$, and the absorption peak of hexagonal-type boron nitrides, such as hexagonal boron nitride, turbostratic boron nitride or amorphous boron nitride is seen in the vicinity of from 1360 to 1400 $cm^{-1}$ and in the vicinity of 800 $cm^{-1}$, and it is considered that the ratio of cubic boron nitride and hexagonal-type boron nitrides corresponds to the ratio of the absorbance of the peak at from 1050 to 1100 $cm^{-1}$ to the absorbance of the peak at from 1360 to 1400 $cm^{-1}$.

On the other hand, it is said that cubic boron nitride synthesized by high pressure method shows a Raman scattering peak by an optical longitudinal wave mode phonon at about 1305 $cm^{-1}$ and a peak by an optical transverse wave mode phonon at about 1056 $cm^{-1}$, and the intensity ratio of these two changes by the relation between the optical axis of the excitation light and the crystal axis. The peak position of the Raman scattering changes by e.g. stress applied to the crystal, crystal defects and the size of the crystal. It reversely varies by compression stress and tensile stress, and in the case of a film obtained from a gas phase, the stress is at most 10 GPa, and the variation range due to the stress is 10 $cm^{-1}$. However, when the effect of crystal defects and crystal size are added, the variation range becomes 15 $cm^{-1}$. Further, the full width at half maximum (FWHM) of the Raman scattering peak is about 5 $cm^{-1}$ for a single crystal of cubic boron nitride having a high quality and a size of from 1 to 2 mm obtained by a high pressure method, and it becomes broader if the crystal size becomes small or crystal defects increase. In the case of a cubic boron nitride film obtained by the conventional gas phase synthesis, the crystal size is several nm, and the Raman peaks has not been observed. Here, the crystal size was estimated by FWHM of the X-ray diffraction peaks or by electron microscope observation, and the FWHM of 111 reflection by CuKα ray is about 3° in 2θ when the crystal size is 5 nm, and the higher the index, the broader. The appearance of the Raman peaks indicates high crystal quality. Gas phase synthesis of cubic boron nitride distinctly showing these scattering peaks and proving to be truly cubic boron nitride by other charaterization methods also, has not been reported.

By known literatures, S. Manorama et al, J. Phys. D: Appl. Phys. 26(1993) 1793; K. Liao and W. Wang, phys. stat. sol. (a) 145(1994) K25; K. Liao and W. Wang, phys. stat. sol. (a) 151(1995) K1; Y. Guo et al, phys. stat. sol. (a) 143(1994) K13; F. Zhang et al, Appl. Phys. Lett. 65(1994) 971 and z. Song et al, Appl. Phys. Lett. 65(1994) 2669, with respect to the synthesis of cubic boron nitride, success in follow-up experiments has not been reported, and the success is very questionable. Accordingly, it can be stated that synthesis of cubic boron nitride of high quality presenting the Raman peaks as mentioned above has not been successfully carried out by the conventional low-pressure synthesis methods.

It has been known that confirmation of cubic boron nitride has to be carried out by at least three conventional methods including X-ray diffraction, infrared spectroscopy and compositional analysis, and the Raman spectroscopy is required to confirm cubic boron nitride of high quality.

The present inventors have invented a method for synthesizing high-density boron nitride by means of plasma CVD method employing boron trifluoride and a nitrogen-containing gas as starting materials before (JP-A-8-208207). However, it was not cubic boron nitride, but turbostratic boron nitride, in view of a crystal structure.

SUMMARY OF THE INVENTION

Under these circumstances, the present invention has been made to overcome the above problems, and to provide a method for synthesizing cubic boron nitride having high crystal quality from a low-pressure gas phase.

The present inventors have found that cubic boron nitride having good crystal quality can be obtained by using a fluorine or a fluorine-containing gas species as one component of starting materials, and by using substrate-biasing, and the present invention has been accomplished.

BRIEF DESCRIPTION OF THE DRAWINGS

FIG. 5 is a graph illustrating a Raman spectrum of the cubic boron nitride obtained by the synthesis method of the present invention, which is measured by back scattering geometry by using an argon ion laser of 514.5 nm. The values of FWHM of the peaks at 1305 $cm^{-1}$ and at 1054 $cm^{-1}$ are 10.4 $cm^{-1}$ and 14.8 $cm^{-1}$, respectively.

DETAILED DESCRIPTION OF THE PREFERRED EMBODIMENTS

Figure 1:
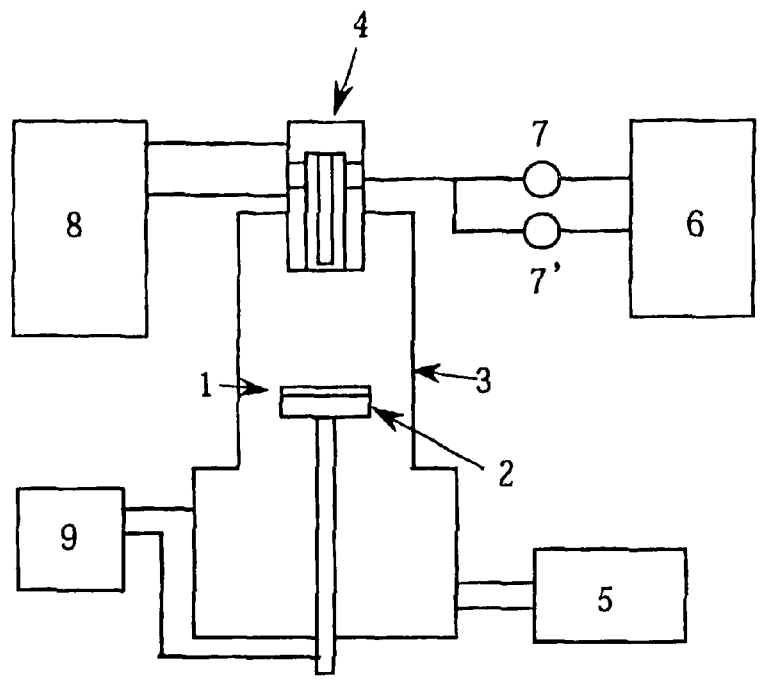
FIG. 1 is a schematic cross-sectional view illustrating an apparatus employing direct-current plasma jet to be used in the method for synthesizing the cubic boron nitride of the present invention.

The cubic boron nitride of the present invention is obtained from a gas phase without using super-high pressure, and distinctly shows, in the Raman spectrum, either a characteristic scattering peak by phonon of an optical longitudinal wave mode at 1305±15 $cm^{-1}$ or a characteristic scattering peak by phonon of an optical transverse wave mode at 1056±15 $cm^{-1}$, or both characteristic scattering peaks. This appearance of the Raman scattering peaks is an index indicating high crystal quality of the cubic boron nitride.

The present invention further provides the cubic boron nitride, wherein the FWHM of the scattered peaks at 1305 $cm^{-1}$ and at 1056 $cm^{-1}$ are at most 50 $cm^{-1}$.

The present invention further provides the cubic boron nitride, wherein, in the powder X-ray diffraction by using CuKα ray, the FWHM of 111, 200, 220 and 311 reflections are at most 1.5°, 2.5°, 2.5° and 3° in 2θ, respectively.

The present invention further provides the cubic boron nitride, wherein, in infrared absorption spectrum, the ratio of the absorbance by the cubic boron nitride component in the vicinity of from 1050 to 1100 $cm^{-1}$, to the absorbance by a hexagonal boron nitride, turbostratic boron nitride or amorphous boron nitride component in the vicinity of from 1360 to 1400 $cm^{-1}$, is at least 2.

The present invention further provides a method for synthesizing the cubic boron nitride from a gas phase, which comprises activating a boron source gas and a nitrogen source gas by means of plasma to precipitate boron nitride, wherein a fluorine gas or a fluorine-containing gas species is used as one component of the gas phase, and substrate-biasing is used.

The present invention further provides the gas phase method for synthesizing the cubic boron nitride, wherein the ratio of hydrogen to fluorine in the number of atoms in the gas phase is at most 2.

The present invention further provides the gas phase method for synthesizing the cubic boron nitride, which is carried out at a temperature of the substrate of from 500 to 1400° C.

The present invention further provides the gas phase method for synthesizing the cubic boron nitride, wherein biasing of the substrate by a direct current electric power or self-biasing by radio-frequency electric power, or by both, is employed for the substrate-biasing.

According to the synthesis method of the present invention, the above cubic boron nitride can easily be produced in the form of a film.

Material Gas

With respect to the material gas used in the synthesis method of the present invention, as a boron source, at least one compound selected from the group consisting of boron hydrides such as diborane and decaborane, of boron halides such as boron trichloride and boron trifluoride, of borohydrides such as sodium borohydride, of borofluorides such as ammonium borofluoride, of organic boron compounds such as triethoxyboron and the like, is used. As a nitrogen source, at least one member selected from the group consisting of nitrogen gas, of hydrides of nitrogen such as ammonia and hydrazine, of fluorides of nitrogen such as nitrogen trifluoride and nitrogen tetrafluoride, and the like, is used.

The boron source gas and the nitrogen source gas react to precipitate boron nitride. Here, the gases are selected so that fluorine is surely present in the gas phase. In the case where no fluorine is contained in the above material gas species, fluorine gas, hydrogen fluoride, halogen fluoride such as chlorine trifluoride or bromine trifluoride, or a halide of an inert gas such as xenon fluoride, can be added to the gas phase, or fluorine obtained by decomposition of an organic fluorine compound such as tetrafluoromethane, a fluorine compound such as sulfur hexafluoride, sulfur tetrafluoride, silicon tetrafluoride, phosphorous pentafluoride or tangusten hexafluoride, or a metal fluoride, can be added to the gas phase, in addition to the above compounds.

Further, an inert gas such as argon or helium, or a hydrogen gas can be optionally added to the gas phase with a purpose of controlling the plasma, or controlling the effect of the fluorine gas. Instead of using separate chemical species of nitrogen and boron, a single chemical species such as amine borane, borazine, aminoborane or dimethylaminoborane can be added to the gas phase. The optimum flow rates of such material gases significantly vary depending upon the type of the plasma, the method for generating the plasma, the size of the synthesis apparatus, the synthesis pressure, and the like. However, excess of hydrogen relative to fluorine is undesirable, and the ratio of hydrogen to fluorine in the number of atoms in the gas phase is preferably at most 2, although it depends on the degree of decomposition of the material gases.

Type of Plasma

In the synthesis method of the present invention, the plasma to be used can be either of non-equilibrium or of equilibrium (thermal), and the electric power source for generating the plasma can be any of direct current, low-frequency alternating current, high-frequency current or microwave. Further, the coupling with the reactor can be any of capacitive coupling, inductive coupling, coupling by an antenna, coupling by a resonator, surface-wave excitation or the like.

Reaction Pressure

In the synthesis method of the present invention, the pressure of the gas phase is from $10^{-6}$ to $10^2$ atom, and it is preferably from $10^{-5}$ to 1 atom in view of the reaction rate and handling easiness.

Substrate

In the synthesis method of the present invention, the substrate on which boron nitride is precipitated, can be any of the semiconductor such as silicon, an insulator such as quartz, or a metal such as tungsten carbide or molybdenum, and it is not particularly limited thereto.

Substrate Temperature

In the synthesis method of the present invention, since an ion bombardment by substrate-biasing is utilized, the temperature of the substrate can have a wide range of from room temperature to 1400° C., and it is particularly preferably from 600 to 1300° C. for synthesizing the cubic boron nitride having high crystal quality.

Substrate-biasing

In the synthesis method of the present invention, substrate-biasing is required to form cubic boron nitride, and negative direct current biasing or self-biasing by radio-frequency electric power can be employed. The range of the bias voltage is from −20 to −350 V, although it varies depending upon many conditions such as the method for generating the plasma, the gas composition, the gas pressure and the plasma density.

Fluorine plays an important roll in the synthesis method of the present invention. However, its detailed function is unclear. It is considered that fluorine having extremely high reactivity may remove the sp2 bonds in the formed boron nitride, so that the cubic boron nitride is likely to form.

Now, the present invention will be described in further detail with reference to examples. However, it should be understood that the present invention is by no means restricted such specific examples.

Direct current plasma jet was employed in Example 1 and microwave plasma was employed in Example 2. However, as mentioned above, any of plasma by means of radio-frequency discharge or low-frequency alternating current, or thermal plasma or non-equilibrium plasma can be employed.

EXAMPLE 1

In a direct current plasma jet CVD apparatus as shown in FIG. 1, a silicon substrate 1 was put on a substrate holder 2, and a reaction chamber 3 was evacuated to 0.01 Torr by an evacuation pump 5. Then, from a gas supplier 6, 20 slm of Ar, 1 slm of $N_2$ and 5 sccm of $H_2$ were flowed through a valve 7, and 30 sccm of 10% $BF_3$/Ar was flowed through a valve 7', and electric is power of 5 kw from a direct-current power supply 8 was supplied to a plasma torch 4, to generate a plasma. Direct-current bias of −80 V was applied to the substrate 1 by a direct-current power supply 9, followed by synthesis of at a substrate temperature of 1000° C. under 50 Torr for 10 minutes to obtain a cubic boron nitride film on the substrate 1.

Figure 3:
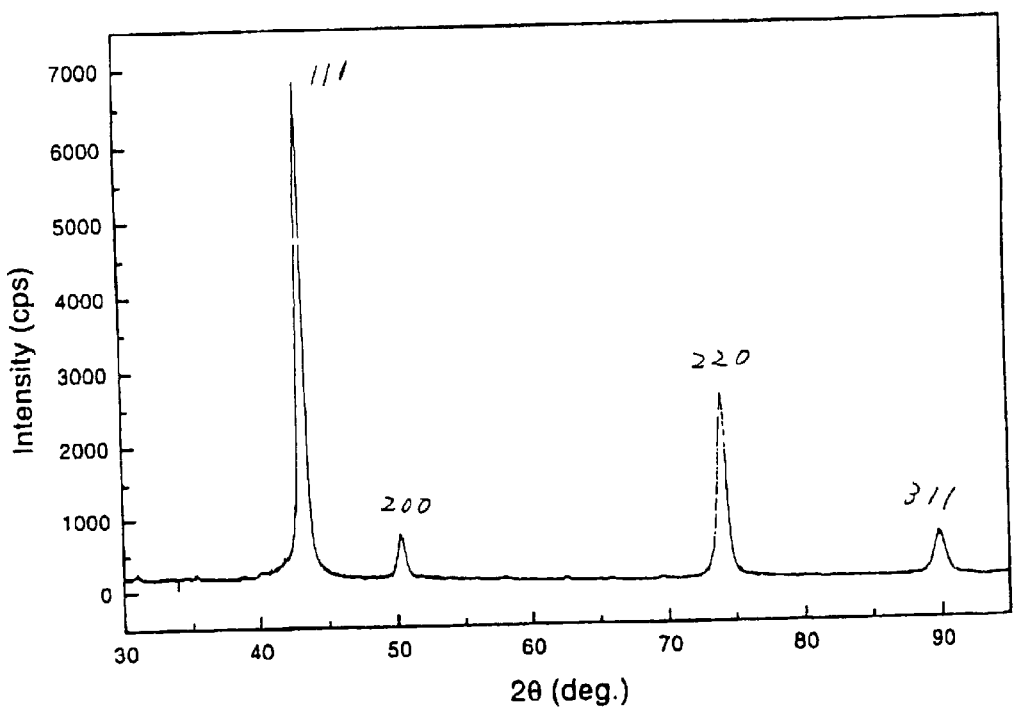
FIG. 3 is a graph illustrating a X-ray diffraction pattern (by CuKα) of the cubic boron nitride obtained by the synthesis method of the present invention. The FWHM of the 111, 200, 220 and 311 reflections are 0.49°, 0.65°, 0.62° and 0.88°, respectively.
Figure 4:
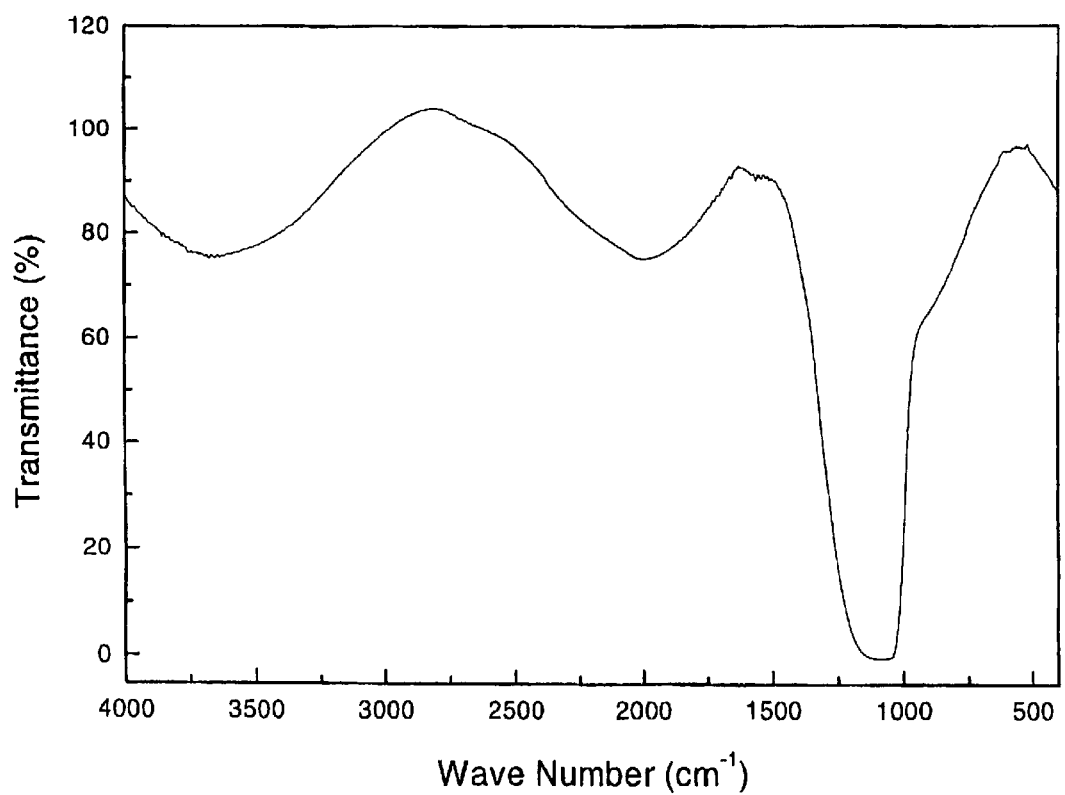
FIG. 4 is a graph illustrating an infrared absorption spectrum of the cubic boron nitride obtained by the synthesis method of the present invention.
Figure 6:
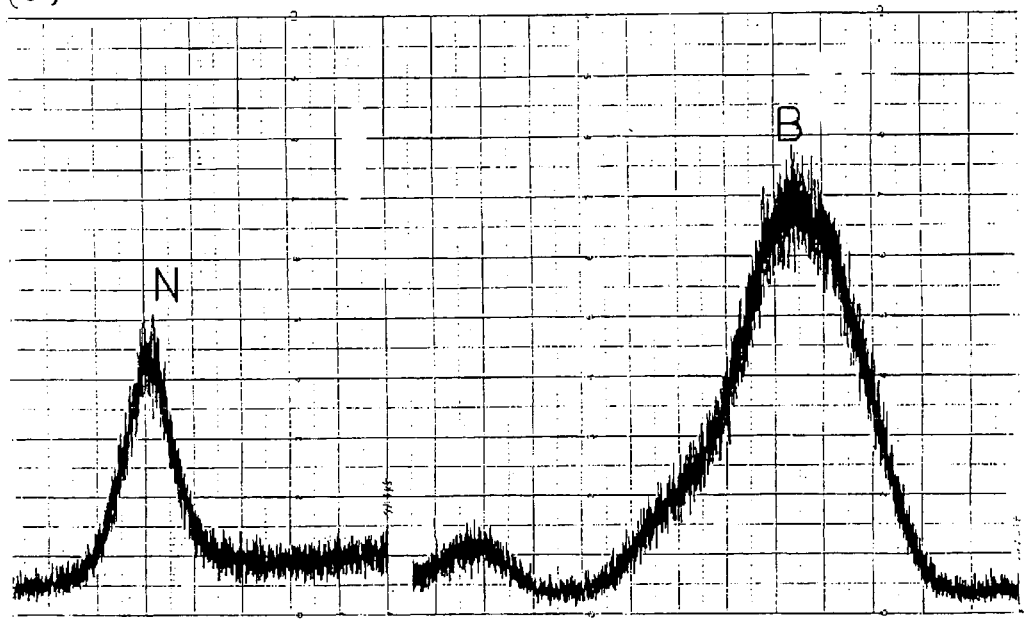
FIGS. 6(a) and 6(b) are graphs illustrating the result of the compositional analysis by EPMA.
Figure 6:
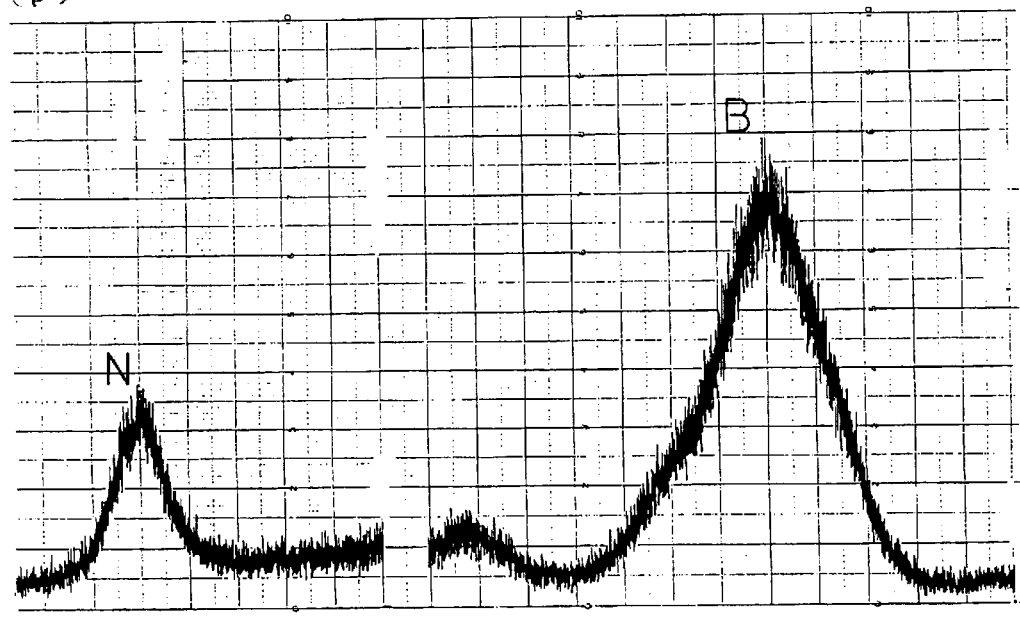

Of cubic boron nitride obtained by the above method, the X-ray diffraction pattern is shown in FIG. 3, the infrared absorption spectrum in FIG. 4, the Raman spectrum in FIG. 5, and the results of the composition analysis by electron probe microanalysis (EPMA) in FIG. 6.

It is evident that 111, 200, 220 and 311 reflections of cubic boron nitride distinctly appeared from FIG. 3, that the absorption of the Reststrahlen of cubic boron nitride significantly appeared in the vicinity of 1100 $cm^{-1}$ from FIG. 4, that scattering peaks of cubic boron nitride by phonon of an optical longitudinal wave mode at 1305 $cm^{-1}$ and by phonon of an optical transverse wave mode at 1054 $cm^{-1}$ distinctly appeared from FIG. 5. In FIG. 4, it is difficult to confirm the presence of an absorption in the vicinity of from 1360 to 1400 $cm^{-1}$ since the absorption attributable to cubic boron nitride is strong and broad, and also it is difficult to confirm an absorption in the vicinity of 800 $cm^{-1}$ due to the interference fringes of light by the film. The proportion of the hexagonal boron nitride, the turbostratic boron nitride and the amorphous boron nitride is small, and considered to be at most 10%.

Further, FIG. 6(a) illustrates the results of analysis of boron and nitrogen in the sample obtained by the method of the present invention, and FIG. 6(b) illustrates the results of analysis of a pyrolytic boron nitride as a standard sample. From these Figures, it is known that the sample obtained by the present method is composed by nitrogen and boron with the ratio of approximately 1:1, although the positions of the peaks are slightly different by chemical shift due to the difference of the structures. From the above results, it was confirmed that cubic boron nitride having high crystal quality can be obtained by the present method.

EXAMPLE 2

Figure 2:
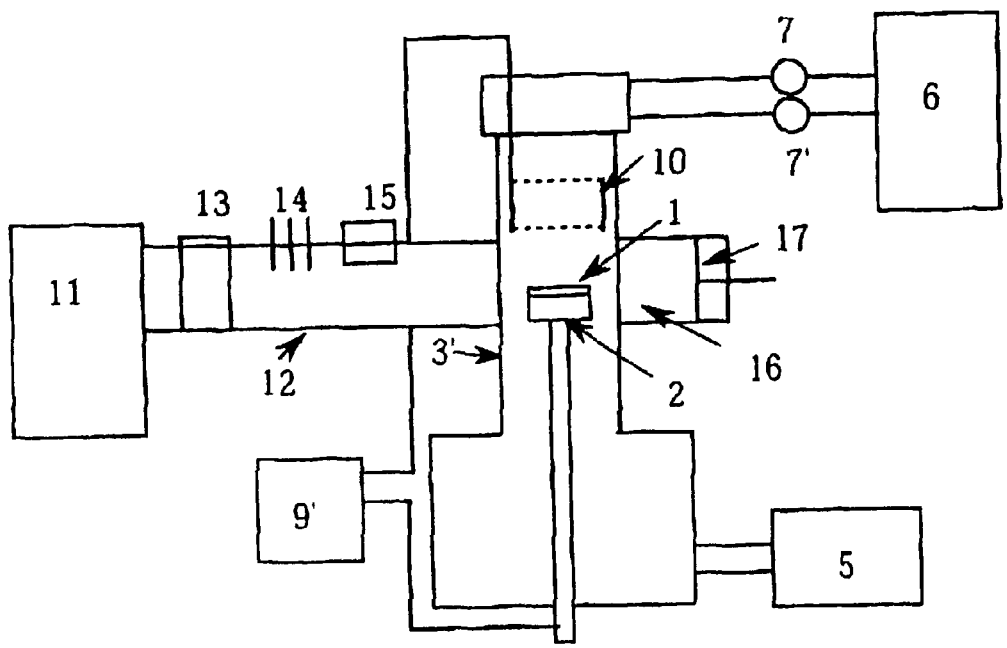
FIG. 2 is a schematic cross-sectional view illustrating an apparatus using microwave plasma to be used in the method for synthesizing the cubic boron nitride of the present invention.

In a microwave plasma apparatus as shown in FIG. 2, a silicon substrate 1 was put on a substrate holder 2, and a reaction chamber 3' made of silica glass was evacuated to 0.001 Torr by an evacuation pump 5. Then, from a gas supplier 6, 50 sccm of $N_2$, 40 sccm of He, 5 sccm of Ar, 10 sccm of 10% $BF_3$/He and 1.5 sccm of $H_2$ were flowed through valves 7 and 7'. 500 W power of 2.45 GHz microwave was supplied from a microwave power source 11 to an applicator 16 through an isolator 13, and a plunger 17 and a stab tuner 14 were adjusted while monitoring a power meter 15, to generate a plasma in the reaction chamber 3'. In FIG. 2, numeral 12 indicates a waveguide.

−40 V bias was applied between the substrate 1 and a counter electrode 10 from a radio-frequency biasing power source 9', followed by reactions under 50 Torr for 1 hour, to obtain a film of cubic boron nitride on the substrate 1. The boron nitride was confirmed to be cubic boron nitride by X-ray diffraction, infrared spectroscopy and Raman spectroscopy in the same manner as in Example 1.

In this microwave plasma apparatus, a reactor of quartz tube type was employed. However, a reactor of resonator type of which the wall was made of a metal can be also employed.

Cubic boron nitride has the highest hardness and thermal conductivity next to diamond, and has a low reactivity with iron family metals. Accordingly, the film of the cubic boron nitride having high crystal quality obtained by the present invention is promising for coating an cutting tools. Further, as it has high crystal quality, its intrinsic characteristics can be obtained, it may be used for preparing p- and n-semiconductors, and devices such as transistors or diodes by p-n junctions which have been succeeded by a high-pressure synthesis method, and it will be applied to devices for electronics and for optoelectronics.

What is claimed is:

1. A cubic boron nitride which is obtained from a gas phase, comprising a crystalized boron nitride body having at least one of a Raman scattering peak by phonon of an optical longitudinal wave mode at 1305±15 $cm^{-1}$ and a Raman scattering peak by phonon of an optical transverse wave mode at 1056±15 $cm^{-1}$.

2. The cubic boron nitride according to claim 1, wherein the Raman scattering peak by phonon of an optical longitudinal wave mode at 1305±15 $cm^{-1}$ and the Raman scattering peak by phonon of an optical transverse wave mode at 1056±15 $cm^{-1}$ have a Full Width at Half Maximum of at most 50 $cm^{-1}$.

3. The cubic boron nitride according to claim 1, wherein said crystalized boron nitride body has Full Widths at Half Maximum of at most 1.5°, 2.5°, 2.5° and 3° at a diffraction angle 2θ of diffraction peaks for 111, 200, 220 and 311 faces, respectively, in powder X-ray diffraction using CuK α ray.

4. The cubic boron nitride according to claim 1, wherein said crystalized boron nitride body has an absorbance in a vicinity of 1050 to 1100 $cm^{-1}$ in infrared absorption spectrum, which makes a ratio of the absorbance of the crystalized boron nitride body to an absorbance of one of hexagonal boron nitride, turbostratic boron nitride and amorphous boron nitride in a vicinity of 1360 to 1400 cm$^{-1}$ in infrared absorption spectrum to be at least 2.

5. A method for synthesizing a cubic boron nitride from a gas phase, comprising activating a boron source gas and a nitrogen source gas by means of plasma to precipitate boron nitride while using substrate-biasing and one of a fluorine gas and a fluorine-containing gas species in the gas phase, wherein a ratio of hydrogen atoms to fluorine atoms in the gas phase is at most 2.

6. The method for synthesizing a cubic boron nitride according to claim 5, wherein said activating step is carried out at a substrate temperature of from 500 to 1400° C.

7. The method for synthesizing a cubic boron nitride according to claim 5, wherein said activating step comprises at least one of biasing by direct current electric power and self-biasing by radio-frequency electric power for the substrate-biasing.

* * * * *